United States Patent
Lee et al.

(10) Patent No.: US 7,888,270 B2
(45) Date of Patent: Feb. 15, 2011

(54) ETCHING METHOD FOR NITRIDE SEMICONDUCTOR

(75) Inventors: Wei-I Lee, Hsinchu (TW); Hsin-Hsiung Huang, Hsinchu (TW); Hung-Yu Zeng, Hsinchu (TW)

(73) Assignee: National Chiao Tung University (TW)

( * ) Notice: Subject to any disclaimer, the term of this patent is extended or adjusted under 35 U.S.C. 154(b) by 650 days.

(21) Appl. No.: 11/896,515

(22) Filed: Sep. 4, 2007

(65) Prior Publication Data
US 2009/0061636 A1    Mar. 5, 2009

(51) Int. Cl.
*H01L 21/302*    (2006.01)
(52) U.S. Cl. .................. 438/745; 438/481; 438/703; 438/756; 438/757; 257/E21.249; 257/E33.074
(58) Field of Classification Search .............. 438/481, 438/703, 745, 756, 757; 257/E21.249, E33.074
See application file for complete search history.

(56) References Cited

U.S. PATENT DOCUMENTS

| | | | |
|---|---|---|---|
| 6,468,882 B2 * | 10/2002 | Motoki et al. | 438/460 |
| 7,097,920 B2 * | 8/2006 | Usui et al. | 428/698 |
| 7,655,959 B2 * | 2/2010 | Lee et al. | 257/103 |
| 7,732,236 B2 * | 6/2010 | Nakahata et al. | 438/46 |
| 2004/0189184 A1 * | 9/2004 | Yasuda | 313/498 |

OTHER PUBLICATIONS

Technical Digest International Workshop on Nitride Semiconductors 2006, Oct. 22-27, 2006, Kyoto, Japan.
Hsin-Hsiung Huang et al., "Extended microtunnels in GaN prepared by wet chemical etch", Applied Physics Letters 89, 202115 (2006), pp. 1-3.
Hsin-Hsiung Huang et al., "Preparation of extended microtunnels in GaN by wet chemical etching", phys. stat. sol. (B) 244, No. 6, (2007)/DOI 10.1002/pssb.200674853, p. 1872-1876.

* cited by examiner

*Primary Examiner*—Matthew C Landau
*Assistant Examiner*—Colleen E Snow
(74) *Attorney, Agent, or Firm*—Bacon & Thomas, PLLC

(57) ABSTRACT

The invention discloses etching method for the nitride semiconductor. Firstly dielectric layer is formed on gallium nitride. The line pattern or dot pattern is formed on the dielectric layer by using the exposure, development, and etching processes. The dielectric layer is used as the mask for the epitaxial lateral overgrowth of follow-up gallium nitride layer. The thick gallium nitride film is grown on the dielectric layer. Then the wet etching process is used to remove the dielectric layer, and the thick gallium nitride film on the dielectric layer is etched to form the specific shape as required.

4 Claims, 13 Drawing Sheets

ETCHING METHOD FOR NITRIDE SEMICONDUCTOR

BACKGROUND OF THE INVENTION

1. Field of the Invention

The invention relates to an etching method for semiconductor, more particularly to an etching method for nitride semiconductor.

2. Description of the Prior Art

At present, the Light Emitting Device (L.E.D.) has become a revolutionary photoelectric product developed by semiconductor process after the development of transistor and laser diode. It is more worth to notice that high brightness gallium nitride (GaN) semiconductor has become one of main element materials of Light Emitting Device.

Thus, as for the manufacturing technology of Light Emitting Device, the traditional semiconductor manufacturing technology has been greatly applied. As for the known technology of semiconductor manufacturing, the dry etching has highly danger of Ion-Bombardment Damage, and it is not apt to get the smooth surface. It also has the adverse effect on the technological development of gallium nitride (GaN) Light Emitting Device.

So comparatively speaking, the wet etching technology has lower danger of Ion-Bombardment Damage, and its cost is relative low, which makes wet etching technology is adopted in Light Emitting Device largely and widely.

In the known art, U.S. Pat. No. 6,355,497 of "Removable large area, low defect density films for led and laser diode growth" used the Epitaxial Lateral Overgrowth (ELOG) method to grow Group III—nitride film, then used the chemical etching method to etch the dielectric layer to get the object of peeling Group III—nitride film from the substrate.

In addition, in the known art, U.S. Pat. No. 7,097,920 of "Group III nitride based semiconductor substrate and process for manufacture thereof" used the Pendeo Epitaxial Lateral Overgrowth (PENDEO) method to grow thick gallium nitride film on Sapphire substrate, then used the molten potassium hydroxide (molten KOH) to etch gallium nitride to get the object of peeling thick gallium nitride film from Sapphire substrate.

In the comparison, although the above-mentioned patents have basic test study on the etching way of wet etching for molten potassium hydroxide and gallium nitride, it is still not clear about the mechanism for the peeling of gallium nitride from the substrate, and it can not get required semiconductor structure after the etching process. Therefore, it is unable to become the main requirement of semiconductor process.

SUMMARY OF THE INVENTION

The invention relates to an etching method of gallium nitride (GaN) semiconductor. At first, a dielectric layer is formed on gallium nitride template. The line pattern or dot pattern is formed on said dielectric layer by using the exposure, development, and etching processes. The said dielectric layer is used as the mask for the Epitaxial Lateral Overgrowth of follow-up gallium nitride layer. The thick gallium nitride film is grown on the dielectric layer. Then the wet etching process is used to remove the dielectric layer, and the thick gallium nitride film on the dielectric layer is etched to form the specific shape as required, and finally the thick gallium nitride film is peeled from the substrate.

The invention uses the molten potassium hydroxide (molten KOH) to etch silicon dioxide ($SiO_2$) dielectric layer first and etch the gallium nitride upward to form a specific shape, in order to get the object of peeling the gallium nitride from the substrate. It can be used as the technology to peel thick semiconductor film from the original substrate.

The invention uses the Epitaxial Lateral Overgrowth (ELO) and the Pendeo Epitaxial Lateral Overgrowth (PENDEO) technology to grow a thick gallium nitride film on Sapphire substrate, and uses the molten potassium hydroxide to etch gallium nitride to get the object of peeling thick gallium nitride film and Sapphire substrate easily. So, it not only can be used in the Epitaxial Lateral Overgrowth process, but also can be used in the Pendeo Epitaxial Lateral Overgrowth process.

The invention uses the etchant to carry on the selective etching of gallium nitride to form a specific and stable crystal surface. It can form a neat triangular micrometer tunnel in the thick gallium nitride film, which becomes a method to manufacture the triangular tunnel in the gallium nitride. This invention can also be applied to the semiconductor process of other chemical compound.

The invention uses the molten potassium hydroxide as the etchant to get high etching rate for silicon dioxide and thick gallium nitride film, which achieves the peeling of the thick semiconductor film and the original substrate. The rational explanation and feasibility of its mechanism has been provided by the result of this invention.

The invention introduces the air into the nitride semiconductor, to increase its light extraction efficiency, and can produce specific crystal facets with regular arrangement in the nitride semiconductor.

The invention uses the chemical etching method to separate the crystal template layer of compound from the original substrate, which can eliminate the stress generated due to inconsistent heat expansion coefficient and crystal lattice.

The invention uses the chemical etching method to produce the regular tunnel in the nitride semiconductor, which can also produce specific crystal facets in the nitride semiconductor.

The invention can be used to substitute the expensive Laser Lift-Off (LLO) equipment to manufacture the nitride semiconductor substrate. It not only can reduce the manufacturing cost, but also can increase the yield of product.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

The basic principle of this invention is to form a dielectric layer on gallium nitride. The line pattern or dot pattern is formed on the dielectric layer by using the exposure, development, and etching processes. After etching, the Epitaxial Lateral Overgrowth process is used to grow a thick gallium nitride film on the structure, and the chemical etching method is used to produce the triangular micrometer tunnel or specific cone structure on the dielectric layer.

Figure 1A:
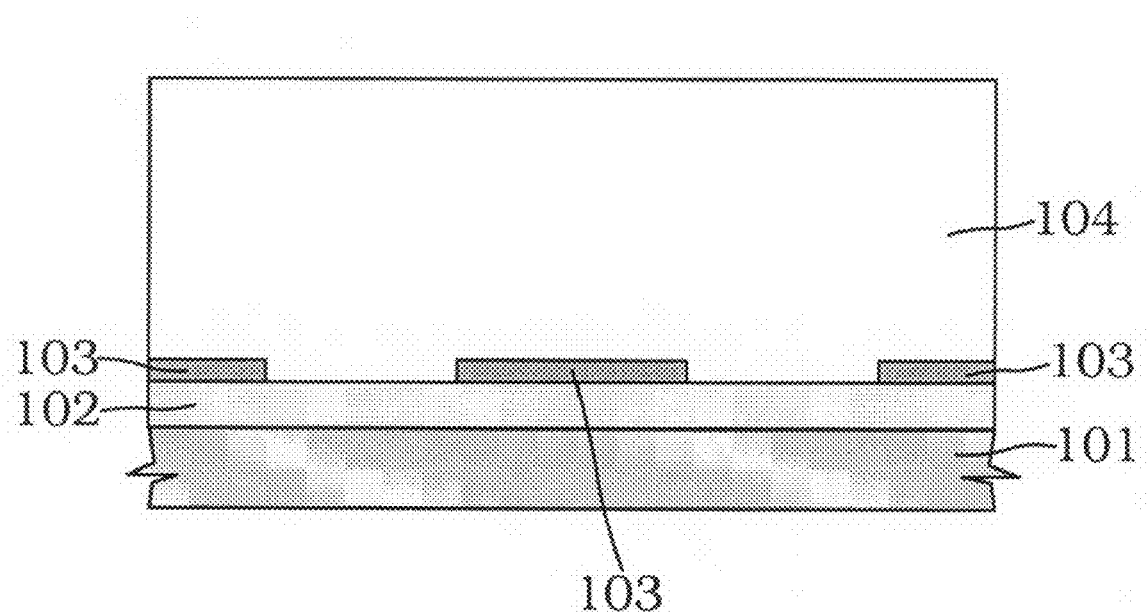
FIG. 1A to 1E are diagram schematically illustrating the first embodiment of the invention.

This invention relates to an etching method of gallium nitride, the first embodiment is described in detail as follows:

As shown in FIG. 1A, this invention offers a semiconductor substrate 101, a first gallium nitride layer 102 is formed on the surface of the semiconductor substrate 101, a dielectric layer 103 is discontinuously formed on the surface of the first gallium nitride layer 102, a second gallium nitride layer is formed on the surface of the silicon dioxide dielectric layer 103 and the first gallium nitride layer 102, and the thickness of second gallium nitride layer 104 is thicker than that of the first gallium nitride layer 102, which is called the thick gallium nitride film.

Figure 1B:
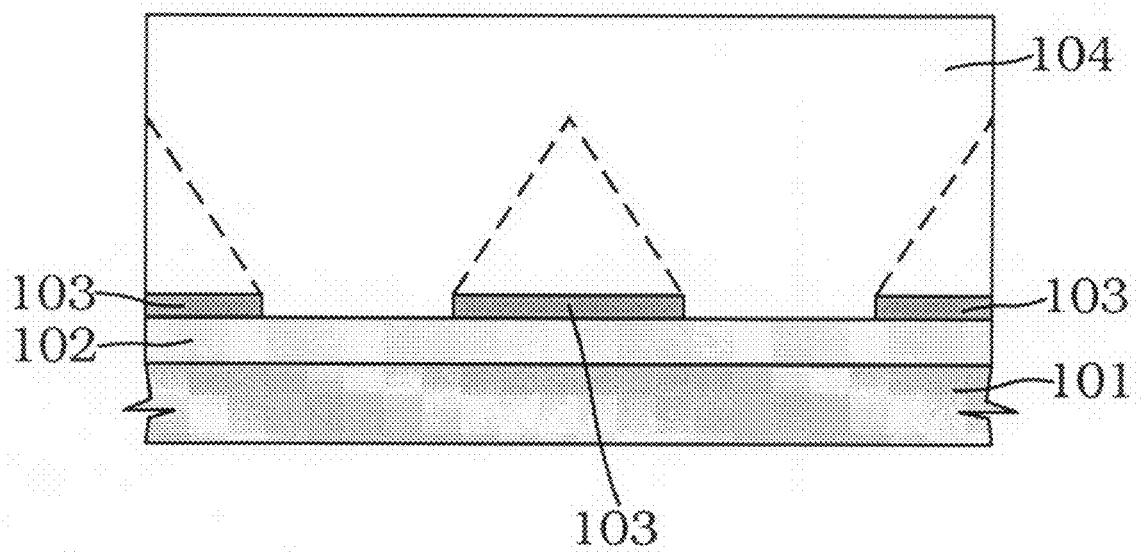

As shown in FIG. 1B, the Epitaxial Lateral etching process is used to remove the dielectric layer 103. And the dashed line shows the possible continuous etching direction.

Figure 1C:
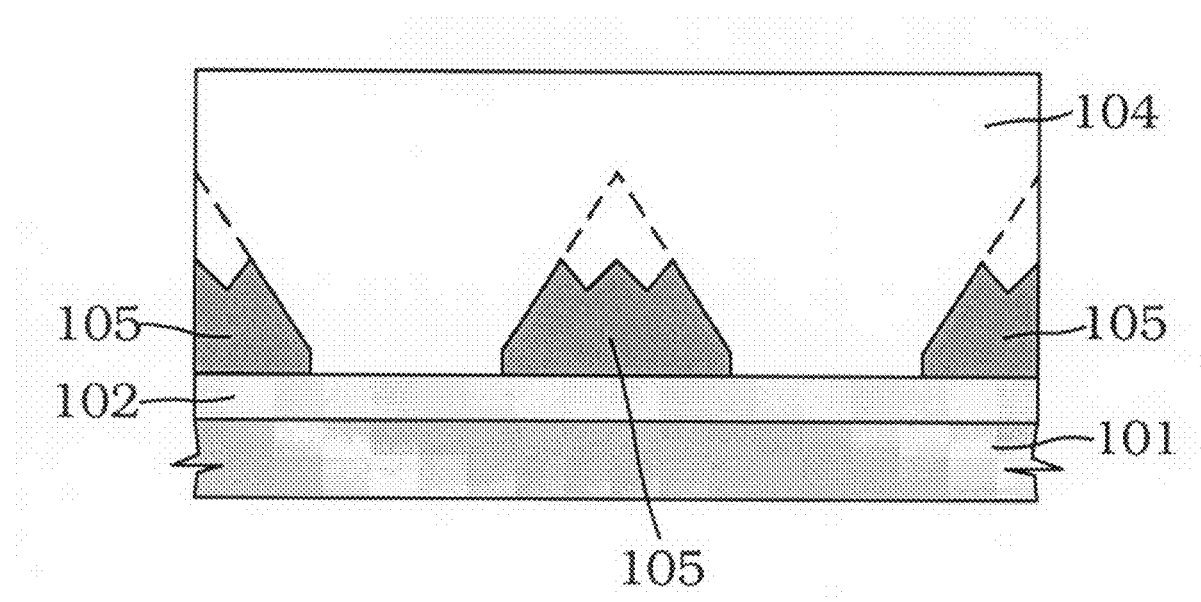

As shown in FIG. 1C continuously, the lateral etching process is used to remove the second gallium nitride layer 104 on the dielectric layer 103 continuously, to form the hole 105 gradually.

Figure 1D:
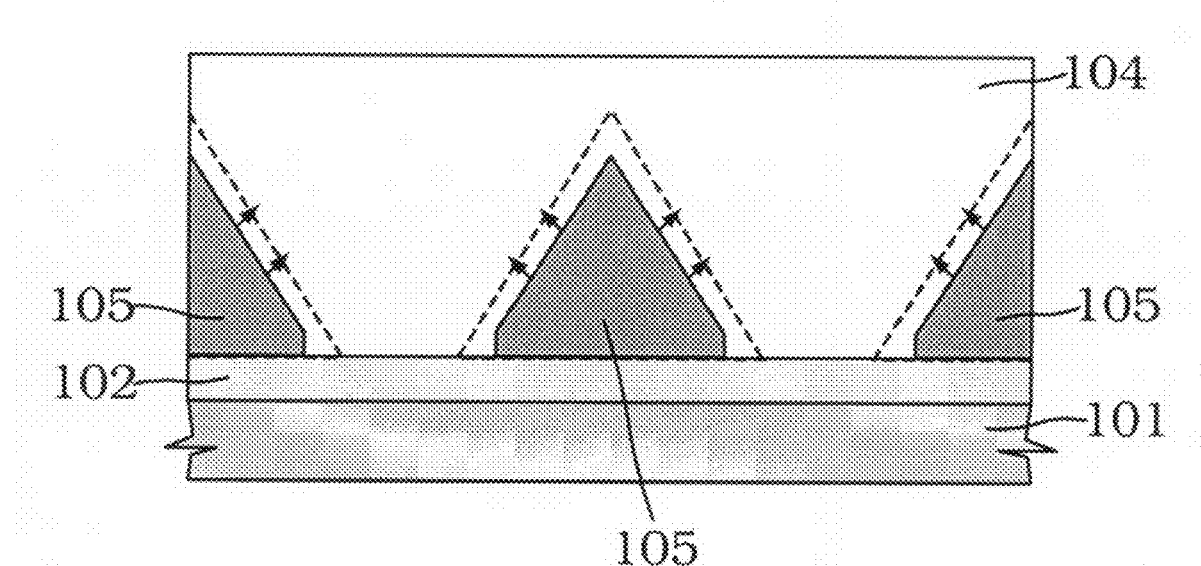

As shown in FIG. 1D continuously, the lateral etching process is still used to remove the second gallium nitride layer 104 to expand the hole 105, so as to form a specific shape of the second gallium nitride layer 104.

Figure 1E:
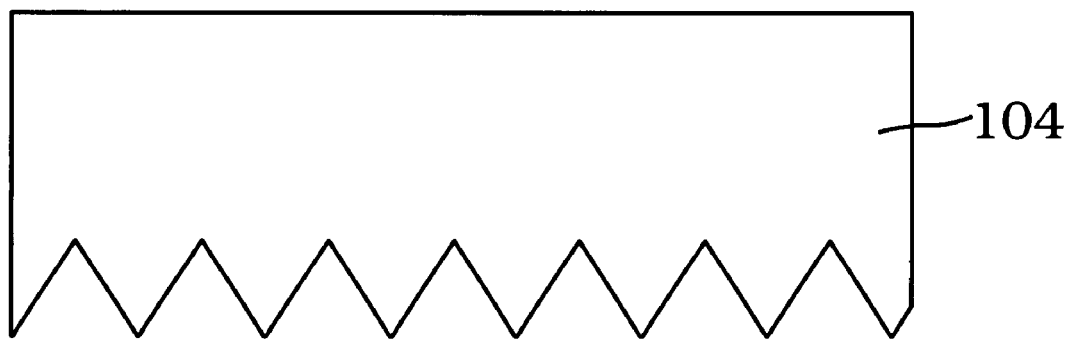

As shown in FIG. 1E finally, upon removing the semiconductor substrate 101 and the first gallium nitride layer 102, the hexagonal cone shape formed on the second gallium nitride layer 104 can be seen clearly.

Figure 2A:
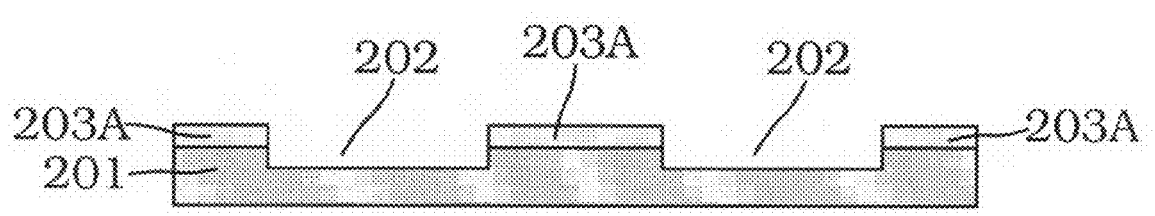
FIG. 2A to 2E are diagram schematically illustrating the second embodiment of the invention.

This invention relates to an etching method of gallium nitride, the second embodiment is described in detail as follows:

As shown in FIG. 2A first, this invention offers a semiconductor substrate 201, the semiconductor substrate 201 has a concave part 202 and other convex part, and the first gallium nitride layer 203A is formed on the other convex part of the semiconductor substrate 201.

Figure 2B:
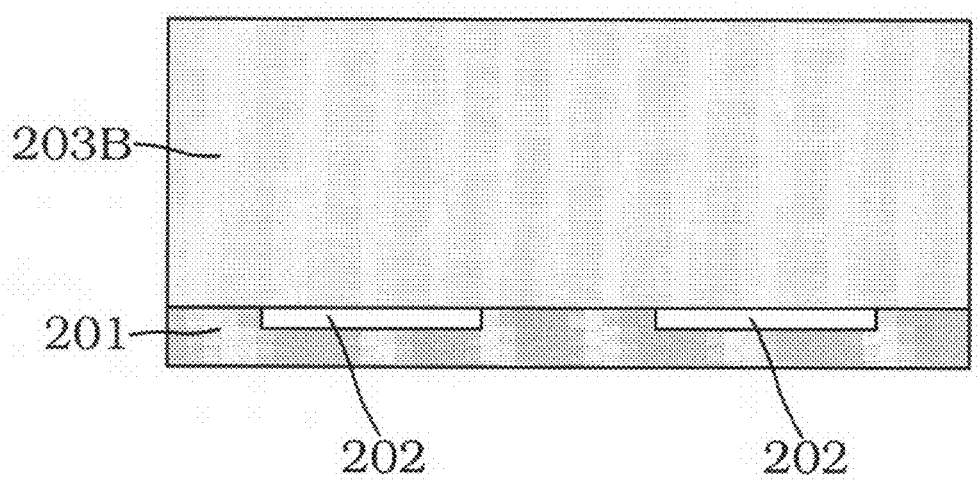

As shown in FIG. 2B, the second gallium nitride layer 203B is formed on the surface of first gallium nitride layer 203A, wherein the concave part of the semiconductor substrate 201 is still remained, the first gallium nitride layer 203A is combined in the second gallium nitride layer 203B to become the thick gallium nitride film 203B.

Figure 2C:
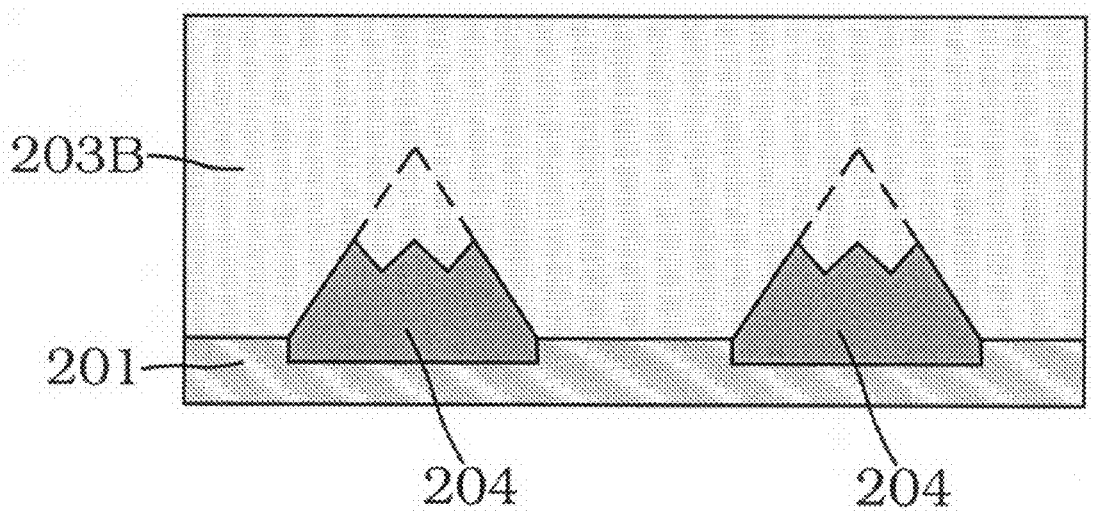

As shown in FIG. 2C, through entering the concave part of said semiconductor substrate 201, the lateral etching process is used to remove the second gallium nitride layer 203B on the concave part 202, to form the hole 204 gradually.

Figure 2D:
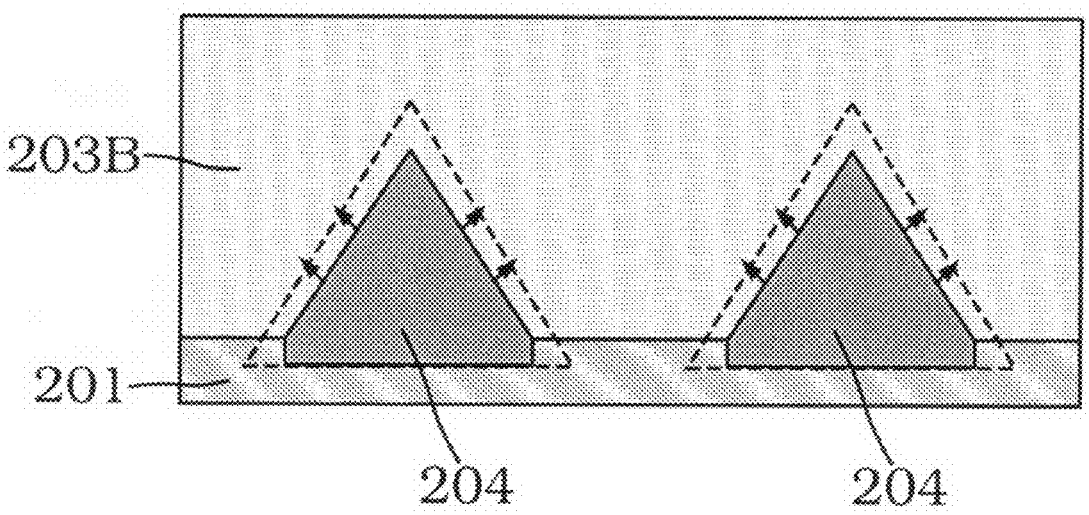

As shown in FIG. 2D, the hole 204 has been expanded gradually to form a specific shape of the second gallium nitride layer 203B.

Figure 2E:
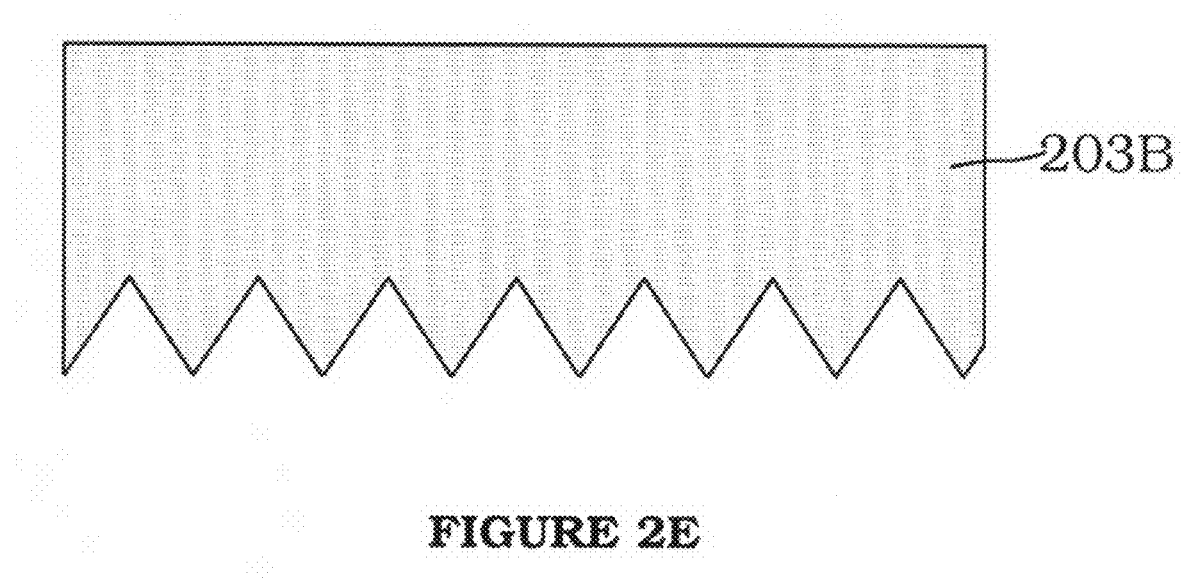

As shown in FIG. 2E finally, upon removing the semiconductor substrate 201, the hexagonal cone shape formed by the second gallium nitride layer 203B can be seen clearly.

Figure 3A:
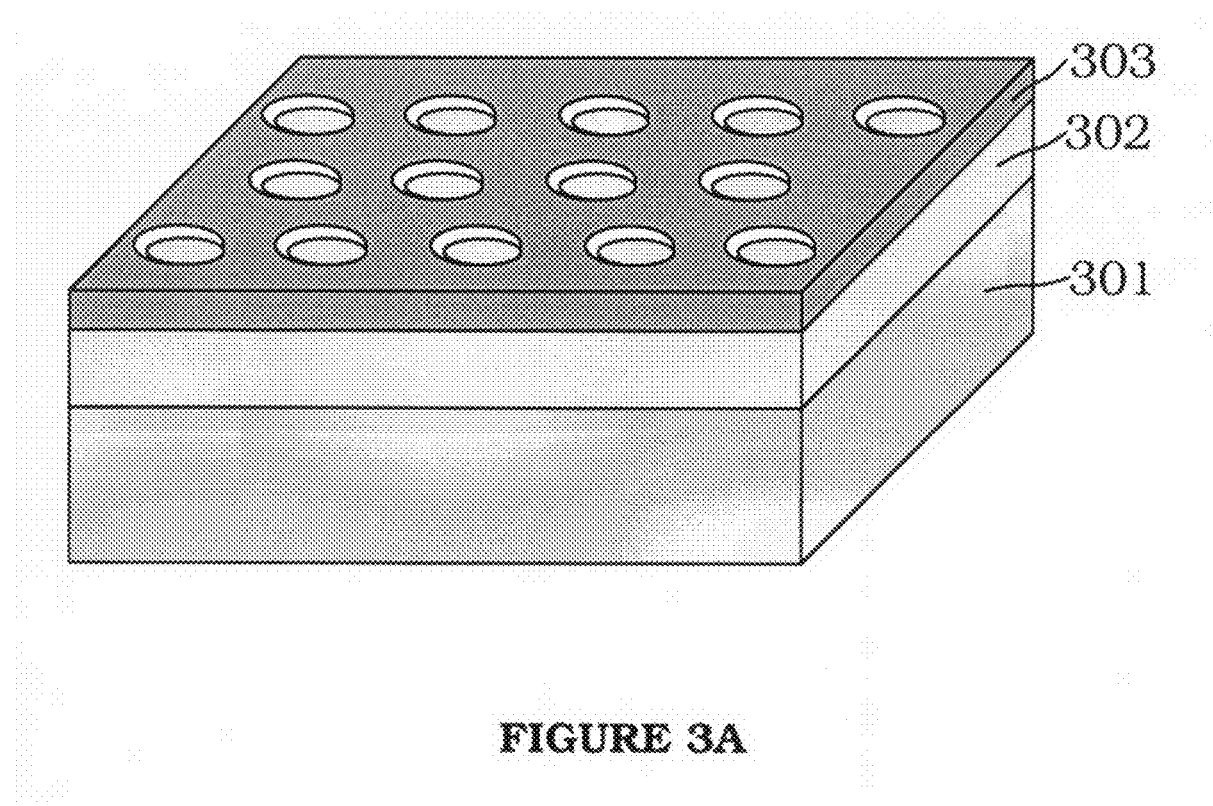
FIG. 3A to 3D are diagram schematically illustrating the third embodiment of the invention.

This invention relates to an etching method of gallium nitride, the third embodiment is described in detail as follows:

As shown in FIG. 3A first, this invention offers a semiconductor substrate 301, a first gallium nitride layer 302 is formed on the surface of the semiconductor substrate 301, a dielectric layer 303 is formed on the surface of the first gallium nitride layer 302, wherein the dielectric layer 303 has a specific empty hole shape.

Figure 3B:
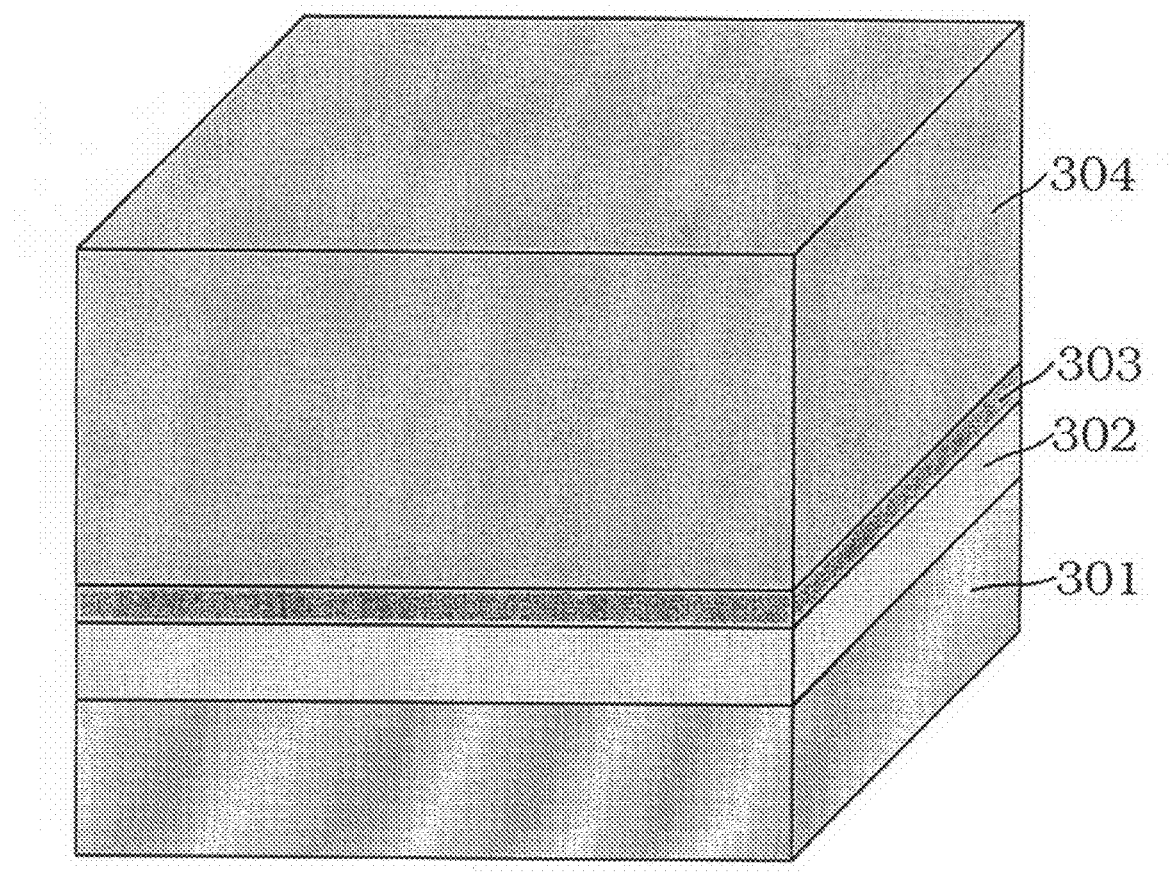

As shown in FIG. 3B continuously, a second gallium nitride layer 304 is formed on the dielectric layer 303.

Figure 3C:
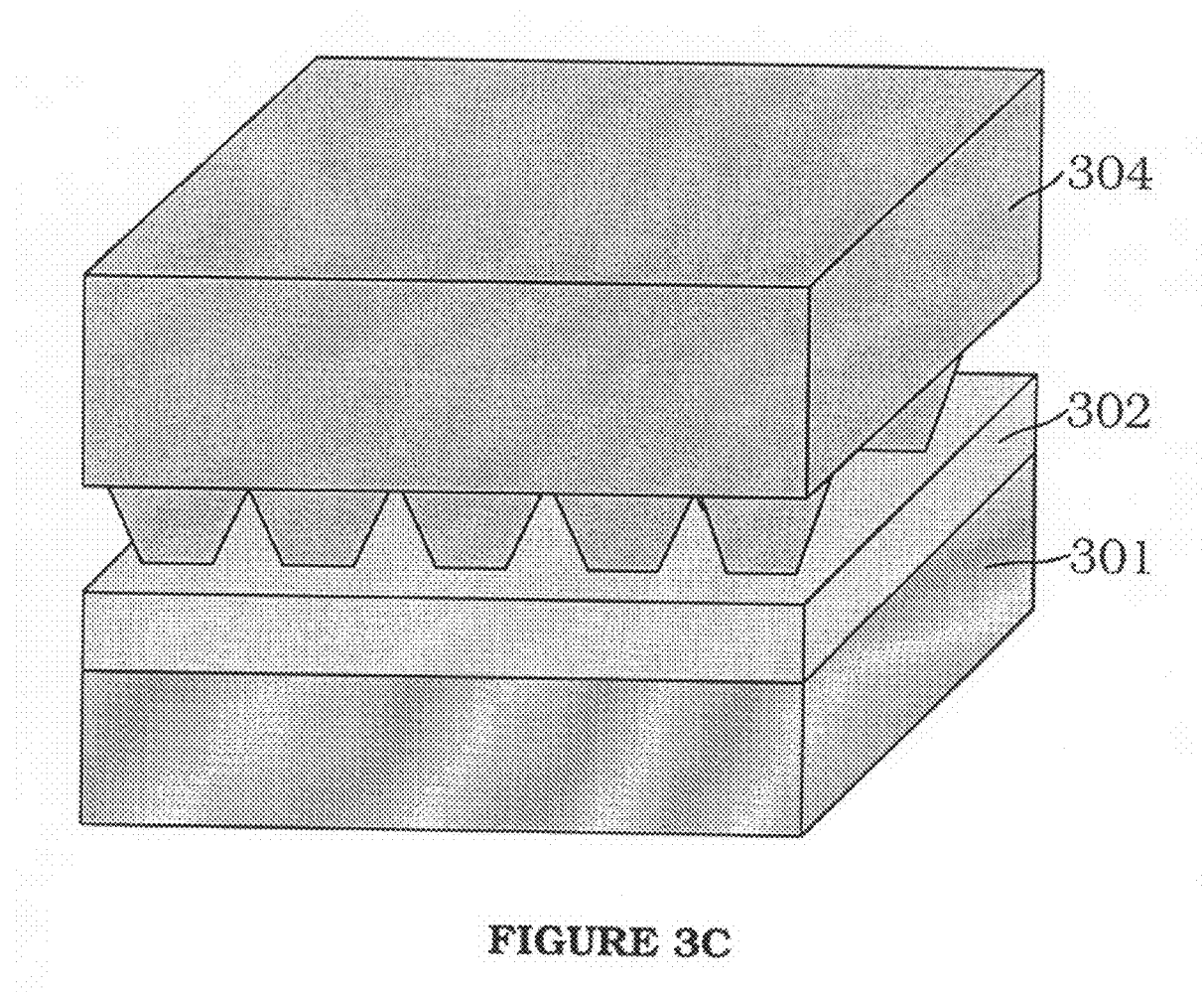

As shown in FIG. 3C, the lateral etching process is used to remove the dielectric layer 303, and continue etching to remove the second gallium nitride layer 304 on the dielectric layer 303.

Figure 3D:
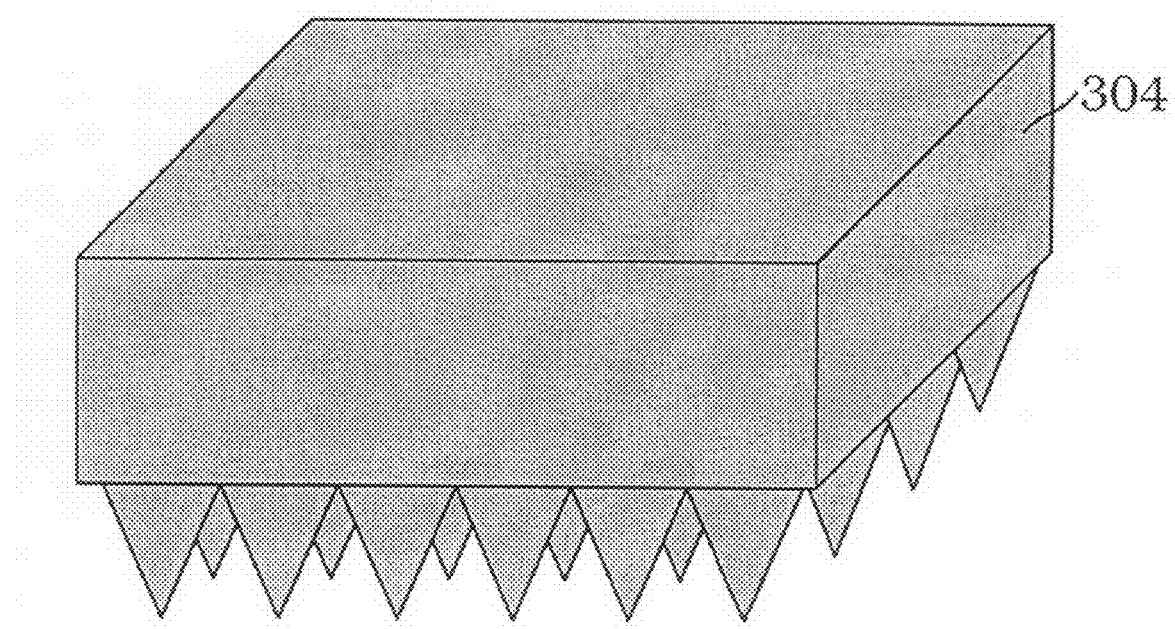

As shown in FIG. 3D formally, upon removing the semiconductor substrate 301 and the first gallium nitride layer 302, the hexagonal cone shape formed by the second gallium nitride layer 304 can be seen clearly.

Figure 4A:
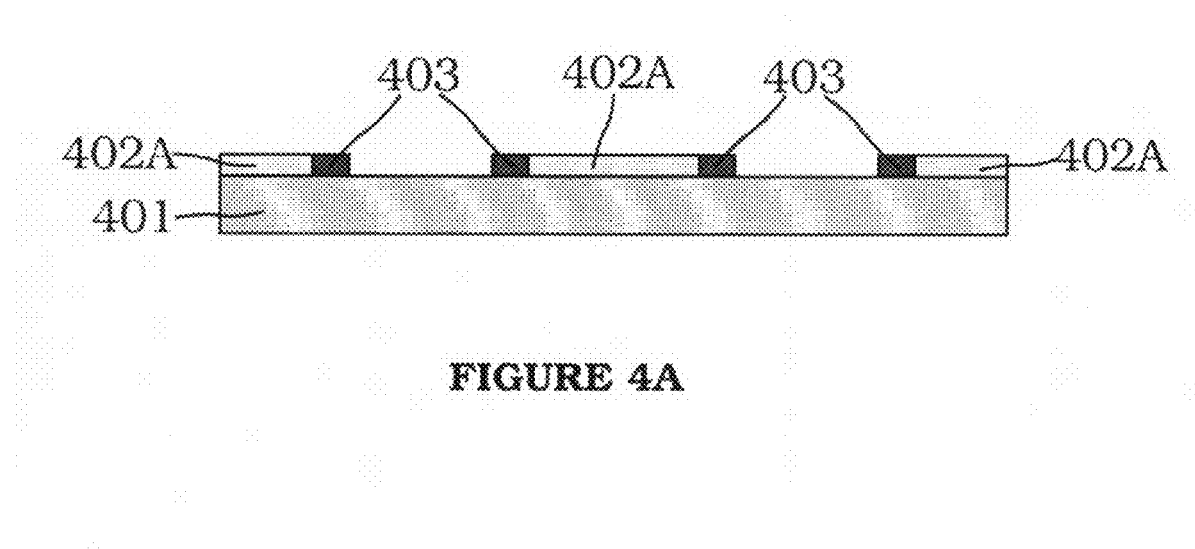
FIG. 4A to 4E are diagram schematically illustrating the fourth embodiment of the invention.

This invention relates to an etching method of gallium nitride, the fourth embodiment is described in detail as follows:

As shown in FIG. 4A first, this invention offers a semiconductor substrate 401, a first gallium nitride layer 402A, and the first gallium nitride layer 402A is discontinuously formed on the surface of the semiconductor substrate 401, the dielectric layer 403 is formed at both two lateral sides of the first gallium nitride layer 402A.

Figure 4B:
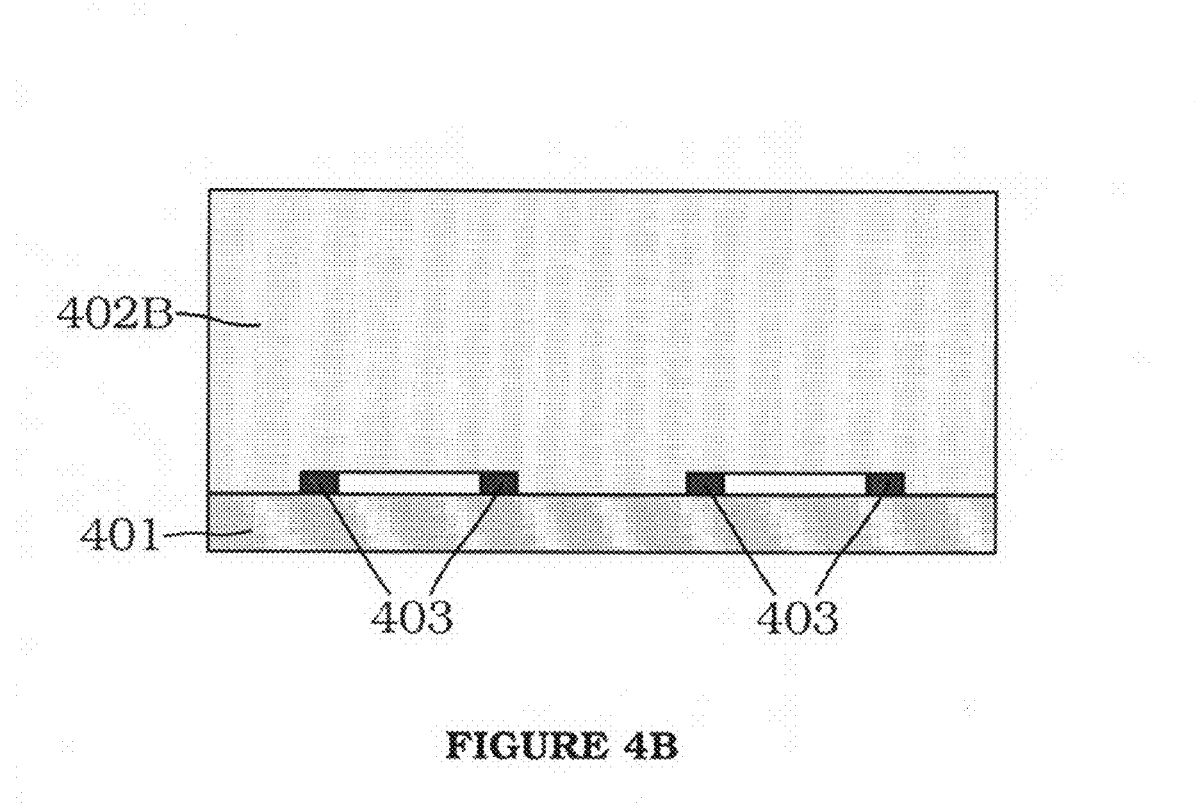

As shown in FIG. 4B, the second gallium nitride layer 402B is formed on the surface of the first gallium nitride layer 402A and the dielectric layer 403, and the first gallium nitride layer 402A is combined in the second gallium nitride layer 402B to become the thick gallium nitride film 402B.

Figure 4C:
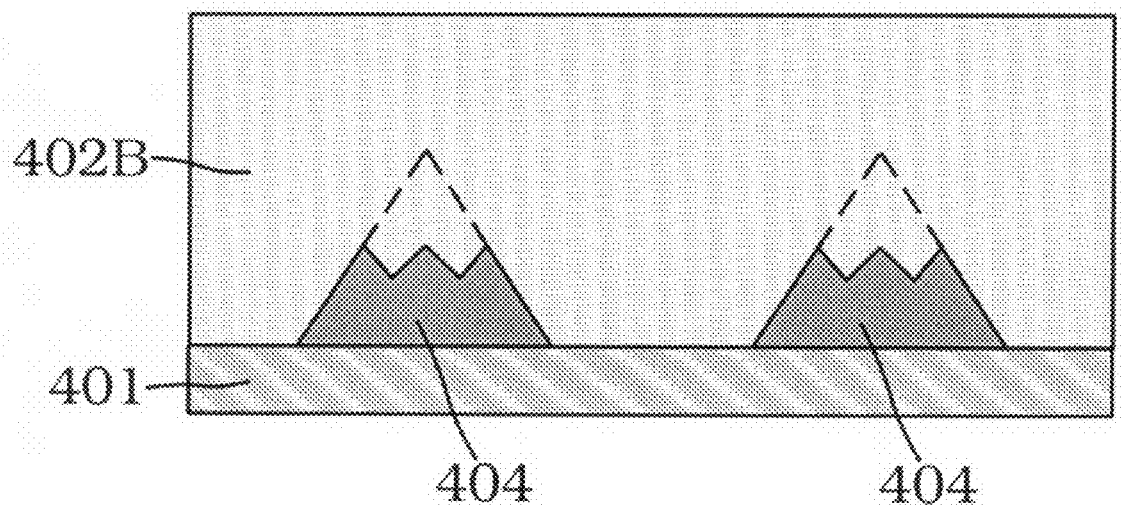

As shown in FIG. 4C, the lateral etching process is used to remove the dielectric layer 403 and the second nitride gallium layer 402B to form the hole 404 gradually.

Figure 4D:
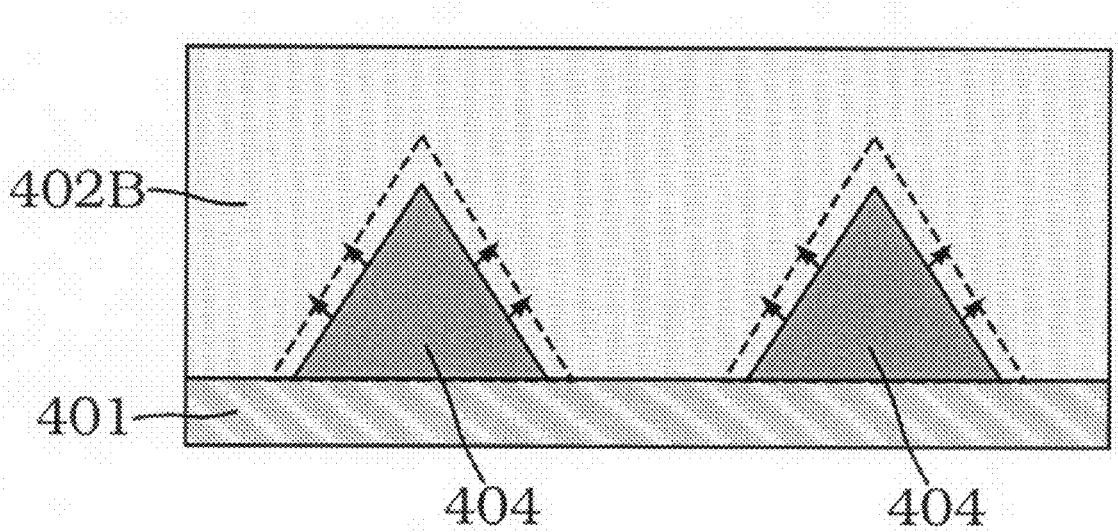

As shown in FIG. 4D, the complete hole 404 is formed on the etched second nitride gallium layer 402B gradually.

Figure 4E:
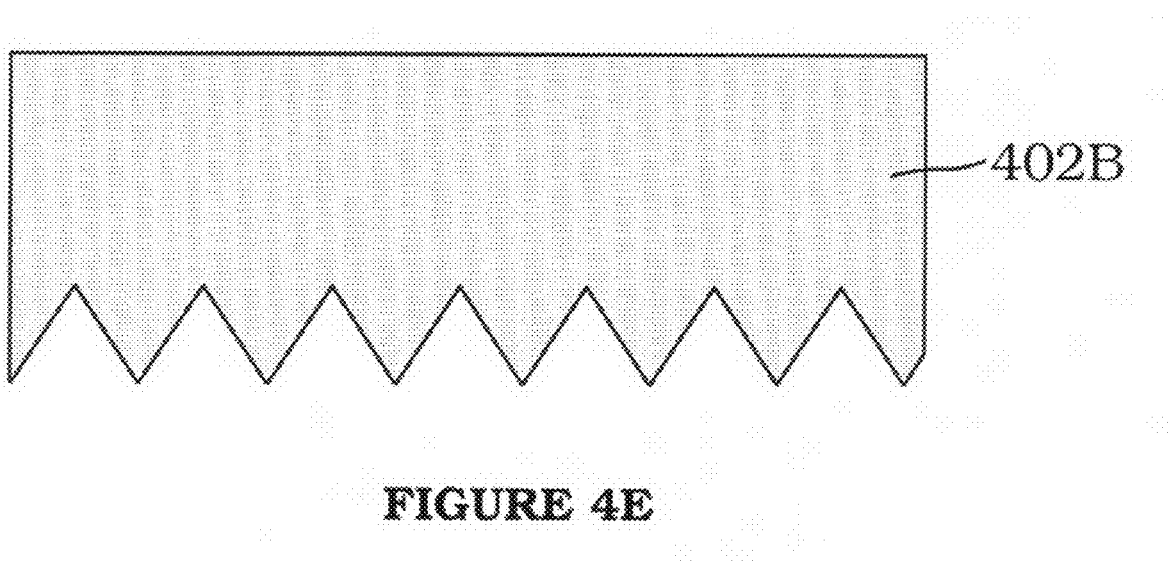

As shown in FIG. 4E finally, upon removing the semiconductor substrate 401, the hexagonal cone shape formed by the second gallium nitride layer 402B can be seen clearly.

The semiconductor substrate of this invention comprises the substrate manufactured by the materials such as the sapphire, silicon carbide, gallium arsenide, or silicon etc.

As for the formation of the gallium nitride layer in this invention, the gallium nitride is used as the crystal growth template to carry the Pendeo Epitaxial Lateral or air-bridge overgrowth process, and the Epitaxial Lateral Overgrowth process is used to grow the thick gallium nitride film on the structure. The Hydride Vapor Phase Epitaxy (HVPE), the Metal Organic Chemical Vapor Deposition (MOCVD), or the Pulsed Laser Deposition (PLD) is used to form the thick gallium nitride film, and the Epitaxial Lateral Overgrowth technology is used to form several tens thick gallium nitride film. The Epitaxial Lateral Overgrowth technology can be substituted by the Pendeo Epitaxial Lateral Overgrowth technology. If the Epitaxial Lateral Overgrowth technology can be substituted by the Pendeo Epitaxial Lateral Overgrowth technology, the Epitaxial will etch the gallium nitride with nitrogen polarity directly, it will not need to etch the dielectric layer first.

The dielectric layer formed in the invention is used as the mask, wherein the silicon dioxide, silicon nitride or zinc oxide etc. can be used for the dielectric layer. The exposure, development, and etching processes are used to make the hole on the mask. The dry or wet etching is used to etch the dielectric layer to form the pattern, wherein the shape of mask may be dot pattern, line pattern, or random pattern.

The molten potassium hydroxide, sodium dioxide or their solution is used as the etchant for the wet etching process of this invention. The etchant will remove the dielectric layer first and etch the gallium nitride upward. After wet etching, the crystal facets of gallium nitride are {1-101}, {11-22}, {33-62}. If the time of etching reaction is sufficient, the thick gallium nitride film can be separated from the original substrate to form the free-standing thick gallium nitride film. The photoelectric-chemical method can be used as the auxiliary process for the etching process.

If the line pattern is used as the shape of mask, the triangular tunnel will be formed first in the etching process, then the side wall of tunnel will be coalesced to separate the gallium nitride from the semiconductor substrate. If the dot pattern or random pattern is used as the shape of mask, the hexagonal cone will be formed first in the etching process, then the thick gallium nitride film will separate from the semiconductor substrate.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for etching a gallium nitride semiconductor having a hexagonal cone shape formed thereon by using a lateral etching process, comprising:

provicing a semiconductor substrate, forming a first gallium nitride layer on the semiconductor substrate, forming a dielectric layer discontinuously on a surface of the first gallium nitride layer, forming a second gallium nitride layer on the dielectric layer and the first nitride layer, wherein a thickness of the second gallium nitride layer being thicker than that of the first gallium nitride layer;

first, using a lateral etching process to remove the dielectric layer;

second, using the lateral etching process to remove the second gallium nitride layer on the dielectric layer to form as a hole;

third, using the lateral etching process to remove the second gallium nitride layer for expanding the hole, so as to form a specific shape of the second gallium nitride layer; and removing the semiconductor substrate and the first gallium nitride layer, so that a hexagonal cone shape is formed on the second gallium nitride semiconductor.

2. The method according to claim 1, wherein the semiconductor substrate is selected from the group consisting of sapphire, silicon carbide, gallium arsenide, and silicon.

3. The method according to claim 2, wherein the dielectric layer is selected from the group consisting of silicon dioxide, silicon nitride and zinc oxide.

4. The method according to claim 1, wherein the dielectric layer is selected from the group consisting of silicon dioxide, silicon nitride and zinc oxide.

* * * * *